United States Patent [19]
Voldman et al.

[11] Patent Number: 6,075,399
[45] Date of Patent: Jun. 13, 2000

[54] SWITCHABLE ACTIVE CLAMP NETWORK

[75] Inventors: Steven H. Voldman, South Burlington, Vt.; David T. Hui, Poughkeepsie, N.Y.

[73] Assignee: International Business Machines Corporation, Armonk, N.Y.

[21] Appl. No.: 09/065,800

[22] Filed: Apr. 23, 1998

[51] Int. Cl.[7] .................................................. H03K 5/08
[52] U.S. Cl. ........................ 327/309; 327/318; 327/328
[58] Field of Search ................................. 327/328, 543, 327/313, 314, 325, 309, 318, 321, 327, 333; 361/56, 91

[56] References Cited

U.S. PATENT DOCUMENTS

| | | | |
|---|---|---|---|
| 3,714,466 | 1/1973 | Spence | 327/328 |
| 3,937,988 | 2/1976 | DeClue et al. | 307/237 |
| 4,015,147 | 3/1977 | Davidson et al. | 307/304 |
| 4,443,717 | 4/1984 | Hague | 327/85 |
| 4,859,877 | 8/1989 | Cooperman et al. | 307/443 |
| 4,943,739 | 7/1990 | Slaughter | 307/443 |
| 5,103,118 | 4/1992 | Peterson | 307/443 |
| 5,220,206 | 6/1993 | Tsang et al. | 327/544 |
| 5,227,677 | 7/1993 | Furman | 307/443 |
| 5,463,335 | 10/1995 | Divakaruni et al. | 327/143 |
| 5,528,190 | 6/1996 | Honnigford | 327/328 |
| 5,583,460 | 12/1996 | Dohi et al. | 327/126 |

OTHER PUBLICATIONS

IBM Technical Disclosure Bulletin, Tri–State Driver with Integrated Hold Circuit, vol. 32, No. 10B, Mar., 1990; W. Haug, E. Klink, W.D. Loehlein and F.C. Wernicke.
IBM Technical Disclosure Bulletin, On–Chip Receiver Featuring Fall–Through Radiation–Hardened Latching, vol. 32, No. 12, May, 1990; M.K. Ciraula, C.M. Durham and D.L. Jallice.
A Dynamic Threshold Voltage MOSFET (DTMOS) for Ultra–Low Voltage Operation, IEEE, 1994; F. Assaderaghi, D. Sinitsky, S. Parke, J. Bokor, P.K. Ko and C. Hu. Dept. Electrical Engineering and Computer Science, Univ. of California at Berkeley, Berkeley, CA 94720.

Dynamic Threshold Body–and Gate–Coupled SOI ESD Protection Networks, IEDM 1994, S. Voldman, F. Assaderaghi, J. Mandelman, L. Hsu and G. Shahidi; IBM Microelectronics Division, Essex Junction, Vermont, IBM T.J. Watson Research, Yorktown Heights, New York and IBM Microelectronics Division, Hopewell Junction, New York.

IBM Technical Disclosure Bulletin, TRANSIENT TERMINATOR FOR TRANSMISSION LINES, vol. 30, No. 7, Dec., 1997; T. Ludwig, H Schettler and R. Zuehlke.

IBM Technical Disclosure Bulletin, DYNAMIC ACTIVE TERMINATOR CIRCUIT, vol. 19, No.10, Mar., 1997; J. Bode and F. Montegari.

IBM Technical Disclosure Bulletin, ACTIVE TERMINATOR FOR TRANSMISSION LINE, vol. 28, No. 10, Mar., 1986.

*Primary Examiner*—Timothy P. Callahan
*Assistant Examiner*—Hai L. Nguyen
*Attorney, Agent, or Firm*—DeLio & Peterson, LLC; Peter W. Peterson; Eugene I. Shkurko

[57] ABSTRACT

An active clamp circuit for digital circuits includes a first MOSFET serially connected between an upper power supply voltage and an input terminal to be clamped, and a second MOSFET serially connected between a lower voltage power supply and the input terminal. The voltages at the gates of the first and second MOSFETs are held at constant first and second reference voltages by a reference circuit and the first reference voltage at the gate of the first MOSFET is less than the second reference voltage at the gate of the second MOSFET. The clamping action can be switched on or off. The device is particularly suited for use with silicon-on-insulator and bulk triple well technologies, where the MOSFETs are dynamic threshold MOSFETs.

20 Claims, 4 Drawing Sheets

SWITCHABLE ACTIVE CLAMP NETWORK

BACKGROUND OF THE INVENTION

1. Field of the Invention

This invention relates to active clamp circuits useful for reducing electrical overshoot and undershoot, for minimizing ringing and similar noise problems and for providing electrostatic discharge (ESD) protection, particularly in high speed metal oxide semiconductor (MOS) integrated circuit applications.

2. Description of Related Art

Clamping circuits are used to control electrical overshoot and undershoot at the signal input of a digital circuit to provide a reliable logic signal under adverse and noisy conditions. Ideally the input voltage to each element in a digital circuit will be in only one of two distinct logic states, either an upper digital voltage or a lower digital voltage, corresponding to the digital ones and zeros of the circuit. In such an ideal system, the input voltage will switch instantly between the up state and the down state, never going above the upper voltage nor below the lower voltage, and spending substantially no time at any intervening voltage between the two states.

In real circuits, however, the input voltage takes a finite amount of time to switch between the two states. Further, when switching between the two states, the input voltage will often overshoot the voltage corresponding to the new state, then oscillate (ring) around the new voltage before settling down.

Clamping circuits (which may also be referred to as termination networks) are designed to minimize the ringing which can seriously degrade circuit performance. A good clamping circuit should dampen ringing and reduce noise so that the signal at the input remains at or near one of the two desired voltage states and switches between those states quickly and cleanly.

Improved clamping performance comes about by supplying or draining current as quickly as possible to/from the network at the input to the circuit being clamped whenever the voltage at the input exceeds or falls below the desired voltage. In order to supply sufficient current, the clamping circuit should have low impedance and a low reflection coefficient in the vicinity of the upper and lower voltages corresponding to the two digital logic states.

On the other hand, in order to maximize switching speed between the two logic states, the impedance of the clamping circuit and the reflection coefficient should be very high during switching for the brief time when the input voltage is between the upper and lower digital voltages. Passive clamping circuits which are still widely used, are unable to effectively meet these opposing requirements for the highest performance applications.

Another requirement for digital circuits is some form of electrostatic discharge (ESD) protection. Generally, separate ESD protection circuits are provided at the input of the circuit to limit the voltage that can be imposed on the circuit at the input terminal even when the circuit is unpowered. It would be desirable if the ESD protection could be incorporated into the clamping circuit. The ability to rapidly drain or source current is important for both clamping and ESD protection. Older designs for clamping circuits that use current limiting resistors do not provide good ESD protection.

As metal oxide semiconductor technology has improved, MOS devices have been constructed with shorter gate lengths, thinner gate oxides and faster response times. As the gate oxide becomes thinner, the device must be powered with a lower voltage power supply to avoid breakdowns and leakage. Lower power supply voltages are also advantageous in reducing power consumption, decreasing heating, and increasing speed through smaller voltage swings.

Such lower voltage designs, however, need even more careful control over the input signal to prevent erratic operation due to ringing or other noise at the input. Good ESD protection for such designs is also critical.

In the following discussion, the positive terminal of the power supply will be referred to as Vdd. In older designs, this voltage is typically +5 volts, however, in newer designs, it may be 3.3, 2.5 or 1.8 volts. The lower voltage terminal of the power supply is referred to as Vss, and this voltage is usually at ground potential (zero volts).

A typical prior art five volt system has used a passive clamping circuit in which one diode is placed between the input terminal and Vss and one is placed between the input and Vdd. The diode between the input terminal and Vdd will conduct when the voltage at the input terminal rises sufficiently above the upper digital voltage to turn on the diode. Thus, this diode limits the input voltage to about 0.7 volts above the desired maximum input voltage, but permits 0.7 volt ringing around the upper digital voltage.

The second diode is positioned between the input terminal and Vss and conducts when the voltage at the input terminal falls one diode drop below the lower digital voltage (usually zero volts). This prevents ringing in excess of about 0.7 volts, but still permits ringing having a magnitude less than the value needed to turn on the passive diode clamp.

Passive clamp circuits of this type work in 5 volt systems because the amplitude of the ringing is relatively small compared to the difference between the upper and lower digital voltages. In lower voltage systems, such as a 3.3 volt system, this 0.7 volt ringing eats into the noise tolerance. In 2.5 and 1.8 volt systems, such ringing becomes an unacceptably large part of the signal swing, producing erratic operation in noisy environments.

During clamping by a passive diode clamp of this type, the excess signal voltage on the input is pulled towards (or clamped to) the positive Vdd supply voltage and the lower signal voltage state is pulled towards (or clamped to) the lower voltage supply (Vss or ground). In the active clamping circuit of the present invention, improved performance is achieved by activating the clamp as soon as or slightly before the input terminal voltage swings above or below the bounds set by the upper and lower digital voltages.

Performance is also improved by driving the input terminal voltage to the upper digital voltage via a connection to Vss when the input voltage is too high (above the upper voltage which is usually Vdd) and by driving the input terminal voltage to the lower digital voltage via a connection to Vdd when the input terminal voltage is too low (below the lower digital voltage which is usually Vss). This increases the speed at which the clamping circuit operates as compared to prior art designs which drive excessively low voltages through a connection to the low voltage supply (Vss) and excessively high voltages through a connection to the high voltage supply (Vdd).

To avoid some of the problems with older designs, source terminated drivers have been used in MOS circuits to lower the drive current of the driver into the net. Unfortunately, this increases delay and slows circuit response. Another problem with this solution is due to complex process tolerance requirements during construction of MOS devices.

This results in poor control of the driver output impedance which also causes ringing.

For low voltage MOS designs, an active clamping circuit is needed, particularly in high performance low voltage designs where the clamp must hold the ringing to much less than the 0.7 volt limit of a passive diode clamp. Active clamp circuits employing transistors instead of diodes are known, but heretofore they have been bipolar in design, and thus are not suited for construction with the remainder of the MOS circuitry.

Another difficulty with prior art designs is that they have been similar to the passive diode clamp circuit described above. They have clamped the high logic signal to the higher Vdd power supply and the lower voltage logic signal to the lower voltage supply Vss. While this is functional, it cannot supply current as quickly to damp out ringing and noise as can a circuit designed according to the present invention. A further problem with prior art clamping circuit designs is the use of current limiting resistors which slow the clamping circuit response time and make them unsuitable for modern high speed MOS field effect transistor (MOSFET) circuits.

There is also a need for low power consumption designs for active clamping circuits and for circuits that may be turned off remotely, particularly during testing operations. These features are not available in prior art designs.

Bearing in mind the problems and deficiencies of the prior art, it is therefore an object of the present invention to provide a clamping circuit specifically adapted for MOS circuits that turns on immediately at the desired clamping voltage, instead of at a diode voltage drop away from the desired voltage.

It is another object of the present invention to provide a clamping circuit that has high impedance during switching, for high switching speed, but low impedance when clamping (for rapid reduction of any ringing).

A further object of the invention is to provide a clamping circuit that may be switched on and off.

Still another object of the present invention is to provide a clamping circuit which has low power consumption.

It is yet another object of the present invention to provide a clamping circuit that provides ESD protection at the input of an attached circuit.

Still another object of the present invention is to provide a clamping circuit suitable for use with low voltage power supply systems, including 2.5 volt, 1.8 volt and lower voltage technologies.

A further object of the invention is to provide a clamping circuit that is compatible with and useful for silicon-on-insulator (SOI) and triple well technologies.

Another object of the present invention is to provide a an active clamping circuit which also operates when unpowered to provide ESD protection.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a clamping circuit having an input terminal for receiving an input voltage, a first power supply terminal for connection to a first supply voltage, and a second power supply terminal for connection to a second supply voltage, the second supply voltage being less than the first supply voltage.

A first MOS field effect transistor having a control lead is serially connected between the first power supply terminal and the input terminal. A second MOS field effect transistor having a control lead is serially connected between the second power supply terminal and the input terminal, and a reference circuit is coupled to the control leads of the first and second MOSFETs for maintaining preselected first and second reference voltages at the control leads of the first and second MOSFETs, respectively. The first reference voltage from the reference circuit is less than the second reference voltage.

The first reference voltage is adjusted to switch on the first MOS field effect transistor and connect the input terminal to the first power supply terminal when the input voltage passes a first limit voltage. The second reference voltage is adjusted to switch on the second MOS field effect transistor and connect the input terminal to the second power supply terminal when the input voltage passes a second limit voltage.

The first reference voltage is preferably adjusted to the second supply voltage plus the threshold voltage of the first MOSFET and the second reference voltage is preferably adjusted to the first supply voltage minus the threshold voltage of the second MOSFET.

In the preferred embodiment of the invention, the first and second transistors are constructed as dynamic threshold voltage MOS field effect transistors (DTMOS). The use of DTMOS devices, with appropriate connection of the body of the DTMOS provides a circuit with significantly improved performance.

In the DTMOS design the DTMOS field effect transistors have bodies constructed on the substrate which can be electrically isolated from other devices on the substrate. This may be accomplished through the use of silicon-on-insulator (SOI) substrates or through triple well implementations in which the MOSFET is isolated via the diode junctions formed by the multiple wells.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–4 of the drawings in which like numerals refer to like features of the invention.

Figure 1:
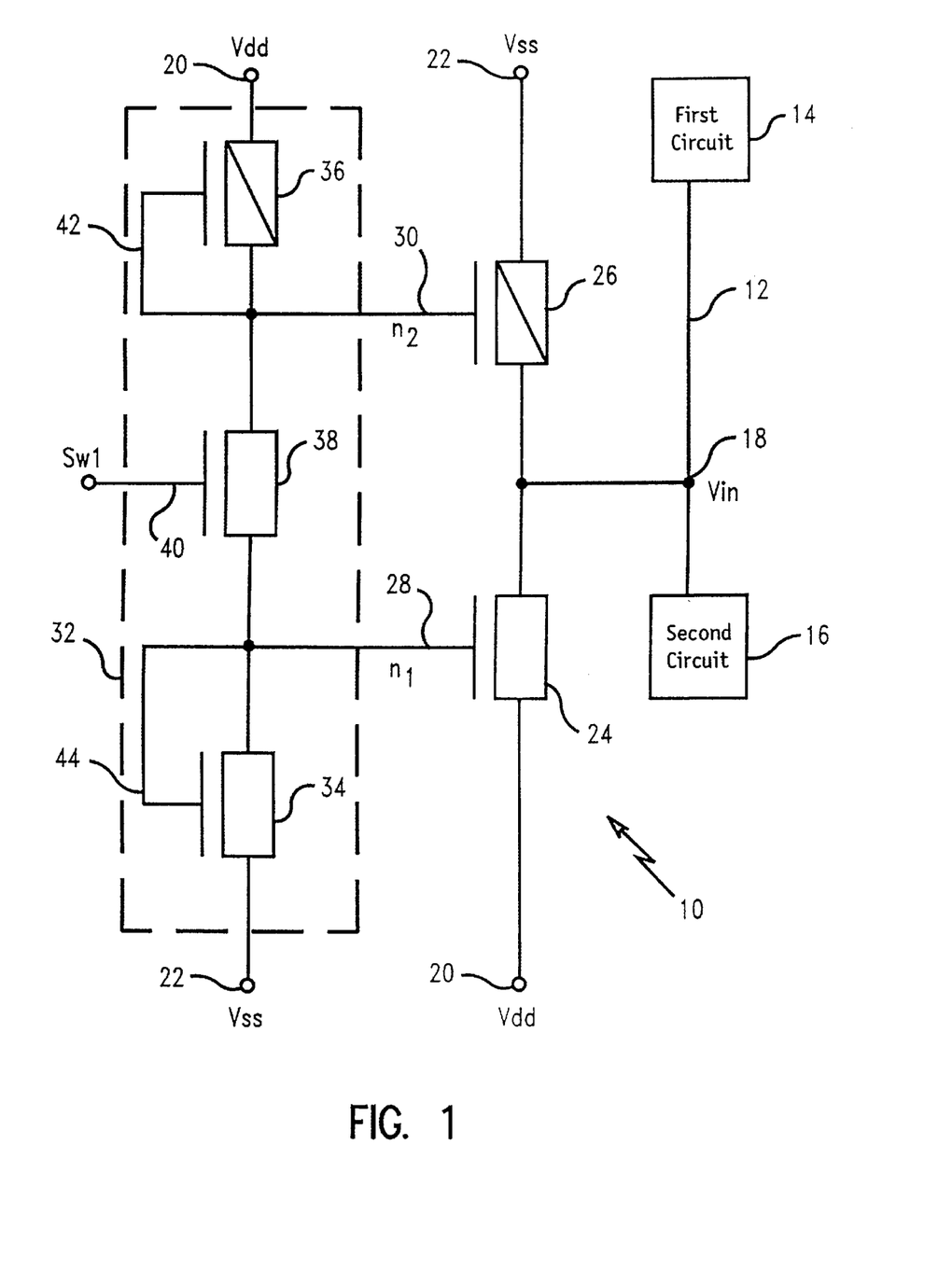
FIG. 1 is a circuit diagram showing a first embodiment of the present invention.

FIG. 1 shows a first embodiment of the invention 10. The active clamping circuit 10 reduces ringing on a network 12 carrying signals from a first circuit 14 to a second circuit 16. An input terminal 18 connects the clamping circuit 10 to the input of circuit 16. Generally, circuit 10 and circuit 16 will be constructed simultaneously and the input 18 will be very close to both circuits whereas circuit 14 and/or additional circuits communicating over net 12 will be located at a more distant location.

In the circuit illustrated, the upper digital voltage corresponding to a binary one is equal to the upper power supply voltage Vdd, which is 1.8 volts. The lower digital voltage corresponding to a binary zero is equal to the lower power supply voltage Vss, which is at ground potential, or zero volts. Although the upper and lower digital voltages are often the same as the upper and lower power supply voltages, this is not necessary, nor is it necessary for the lower power supply voltage to be set to the ground potential.

Circuit 10 is connected to the first power supply Vdd through a first power supply terminal 20 and to the second power supply Vss through a second power supply terminal 22. The second power supply voltage Vss is lower than Vdd, and it will be noted that the right half of FIG. 1 is drawn inverted from the usual orientation, with the upper voltage Vdd at the bottom and the lower voltage Vss at the top of the circuit.

Active clamping is accomplished with first and second metal oxide semiconductor field effect transistors (MOSFETs) 24 and 26. MOSFET 24 is serially connected between the first power supply terminal 20 and input terminal 18. MOSFET 24 is turned on, as described below, to briefly connect input terminal 18 to the upper power supply voltage Vdd via terminal 20 whenever the input terminal voltage at 18 is below the lower digital voltage Vss.

MOSFET 26 works in a complementary manner to the operation of MOSFET 24. MOSFET 26 is serially connected between the input terminal 18 and the second power supply terminal 22 and it turns on, as described below, to connect input terminal 18 to the lower power supply voltage Vss whenever the input terminal voltage at 18 is above the upper digital voltage Vdd. Even though the lower power supply voltage Vss has been drawn at the top of the circuit on the right half of FIG. 1, and even though the upper transistor (MOSFET 26) is connected to the lower power supply voltage Vss, it will be understood from the description above that the upper transistor (MOSFET 26) does control clamping about the upper digital voltage (equal to Vdd in this example) whereas the lower transistor (MOSFET 24) controls clamping about the lower digital voltage (equal to Vss in this example).

MOSFET 24 is an N-type MOSFET and MOSFET 26 is a P-type MOSFET. The diagonal line through the MOSFETs in the drawings indicates P-type MOSFETs. MOSFETs 24 and 26 include corresponding control leads (gates) 28 and 30 through which a reference circuit 32 controls the switching of the MOSFETs to achieve the desired clamping operation.

Reference circuit 32 holds the control lead 28 of MOSFET 24 at a constant first reference voltage n1 and the control lead 30 of MOSFET 26 at a constant second reference voltage n2. The first reference voltage n1 is less than the second reference voltage n2.

The lower reference voltage n1 is set by reference circuit 32 so that MOSFET 24 turns on and connects input terminal 18 to the upper power supply voltage Vdd whenever the voltage at the input terminal 18 drops below the lower digital voltage (Vss) on network 12. The higher reference voltage n2 is set so that MOSFET 26 turns on and connects input terminal 18 to the lower power supply voltage Vss through power supply terminal 22 whenever the voltage at input terminal 18 exceeds the upper digital voltage (Vdd).

The circuit shown may be used with standard 5 volt digital logic designs, but it is most valuable when used with circuits in which Vdd is less than 5 volts, such as on 3.3 volt, 2.5 volt and 1.8 volt systems.

Reference voltage n1 is set so that MOSFET 24 turns on whenever noise, ringing or an electrostatic discharge on the circuit causes the input terminal 18 to fall below Vss. This pulls up the input terminal voltage until it reaches Vss, at which point MOSFET 24 turns off. Similarly, the reference voltage n2 is set by circuit 32 so that MOSFET 26 turns on whenever the voltage at input terminal 18 rises above the upper digital voltage.

The proper operation of MOSFET 24 is achieved by setting the reference voltage n1 equal to the threshold voltage of MOSFET 24 plus Vss. At this value, when the voltage at input terminal 18 drops below Vss, the voltage between input terminal 18 and gate 28 of MOSFET 24 exceeds the threshold voltage for MOSFET 24. MOSFET 24 then turns on, supplying current from power supply terminal 20 and Vdd to the input terminal 18 rapidly bringing the input terminal voltage back to Vss. As soon as input terminal 18 has reached Vss, MOSFET 24 begins to shut off.

Reference voltage n2 on gate 30 of MOSFET 26 is set to Vdd minus the threshold voltage of MOSFET 26. Then when the voltage at input terminal 18 exceeds Vdd, the voltage between gate 30 of MOSFET 26 and input terminal 18 exceeds the threshold voltage of MOSFET 26, turning it on. This connects input terminal 18 to Vss, rapidly reducing the voltage at input terminal 18 to Vdd.

Figure 3:
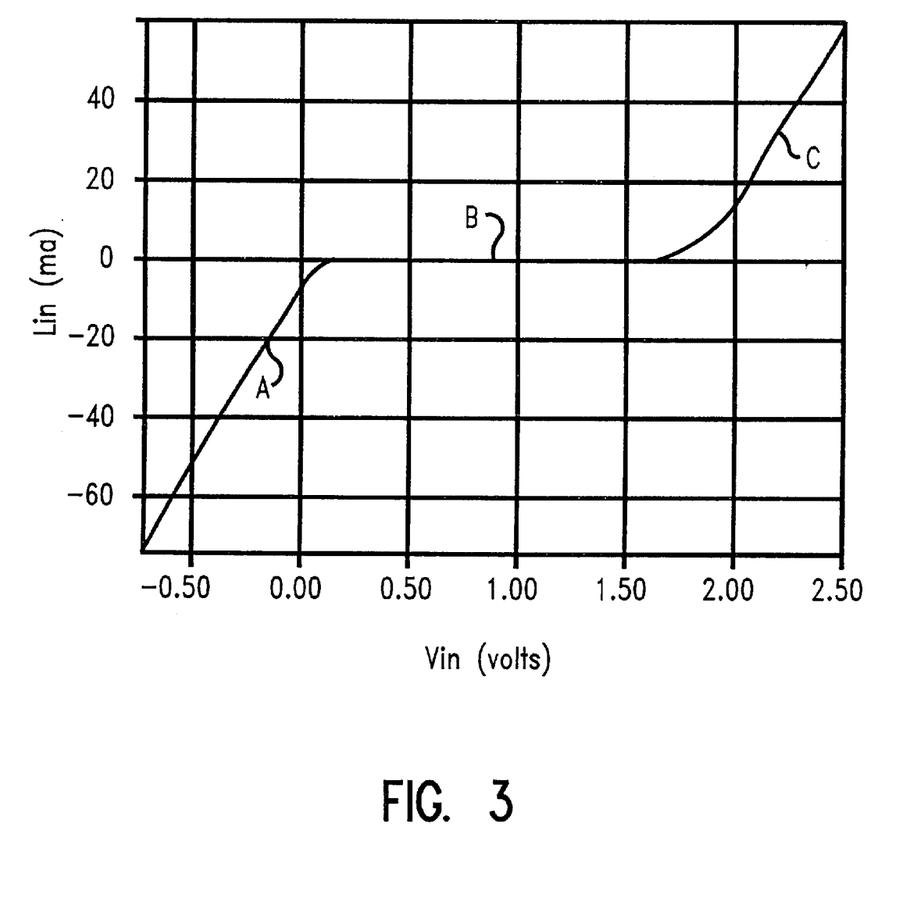
FIG. 3 is a graph of input current as a function of input voltage for an active clamping circuit constructed according to the present invention as intended for use with a 1.8 volt digital logic system.

FIG. 3 provides a graph of current into clamping circuit 10 through input terminal 18 as a function of the input voltage Vin where Vss is set to 0 volts and Vdd is set to 1.8 volts. In the region marked "A" where Vin is less than Vss (0.0 volts), MOSFET 24 is on and current is flowing out of the clamping circuit 10 and into the network 12 at the input to circuit 16. In the region of FIG. 3 marked "B" there is no current flow through the input terminal 18 and both MOSFETs 24 and 26 are off. In the region marked "C", above Vdd (1.8 volts), MOSFET 26 is turned on and current is flowing in the opposite direction from the input terminal 18 through MOSFET 26 to ground.

Figure 4:
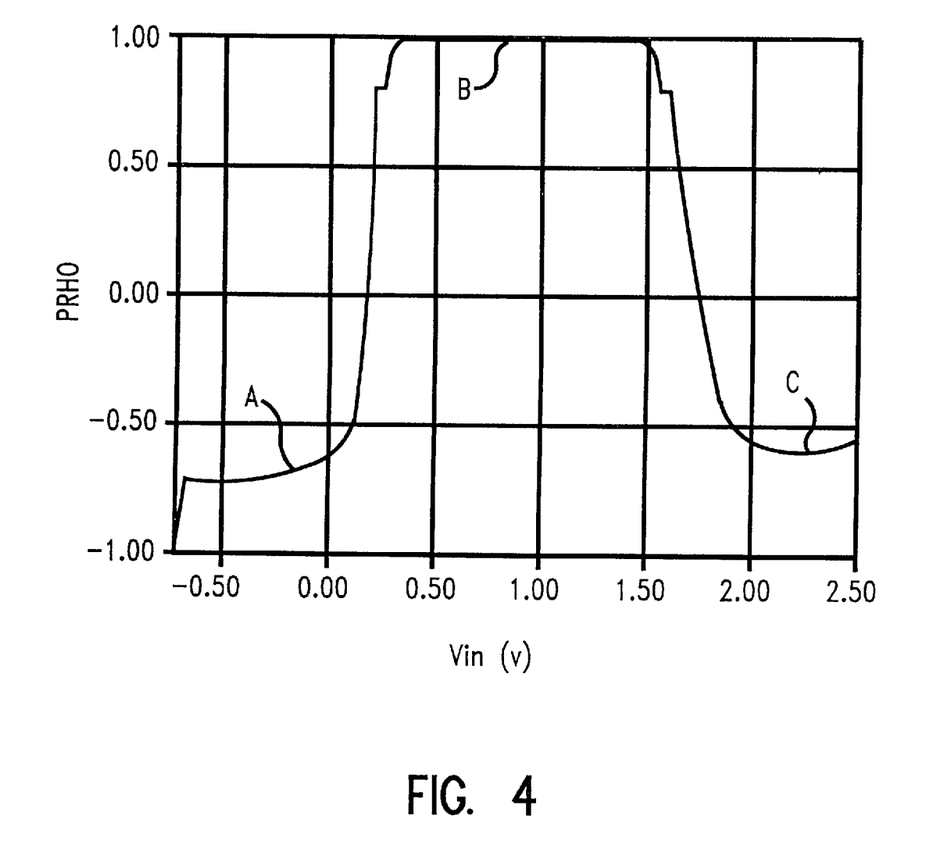
FIG. 4 is a graph of the reflection coefficient as a function of input voltage for an active clamping circuit constructed according to the present invention as intended for use with a 1.8 volt digital logic system.

FIG. 4 shows the reflection coefficient PRHO as a function of input voltage. In the region marked "A" below 0.0 volts, the reflection coefficient is very low. This corresponds to a low impedance and allows current to flow rapidly from the clamping circuit 10 to input node 18. In the region marked "B", above 0.0 volts but below 1.8 volts, the reflection coefficient is near unity. This corresponds to a high impedance and indicates that when the digital voltage on net 12 is changing from low to high, or high to low, the clamping circuit 10 has relatively little effect on the power needed to drive the net and change state.

In region "C", as the input voltage approaches and exceeds 1.8 volts, the reflection co-efficient drops rapidly again allowing the clamping circuit 10 to supply current rapidly as necessary to clamp the voltage at 1.8 volts and prevent noise and ringing in the vicinity of the upper digital voltage.

Referring back to FIG. 1, reference circuit 32 is most easily constructed through the use of the three MOSFETs shown. These three transistors include a third transistor 34 coupled to the second power supply terminal 22, a fourth transistor 36 coupled to the first power supply terminal 20, and a fifth transistor 38 serially connected between the third and fourth transistors 34 and 36.

Transistor 34 is preferably an N-type MOSFET and transistor 36 is preferably a P-type MOSFET. Transistor 38 is preferably a large gate length N-type MOSFET which has a control lead 40. MOSFET 38 can turn off the circuit 10 by turning off current flow from Vdd through MOSFETs 36, 38 and 34 to Vss. Control lead 40 controls the on/off state of MOSFET 38 and thereby controls the on/off state of circuit 10. Although MOSFET 38 is preferably shown as an N-type MOSFET, if the opposite switching logic is desired, transistor 38 can be a P-type MOSFET.

The gate 42 of transistor 36 is connected between MOSFETs 36 and 38 and to the gate 30 of MOSFET 26. This automatically sets the reference voltage n2 at the gate 30 to Vdd minus the threshold voltage of P-type MOSFET 36. Since MOSFET 26 is also a P-type MOSFET, reference voltage n2 will be correct.

The gate 44 of MOSFET 34 is connected between MOSFETs 34 and 38 and to the gate 28 of MOSFET 24 to produce the first reference voltage n1. This automatically sets the reference voltage n1 at the gate 28 of MOSFET 24 to Vss plus the threshold voltage of N-type MOSFET 34. Since MOSFET 24 is also an N-type MOSFET, reference voltage n1 will be correct.

Transistor 38 acts as a switch which will allow no current to flow when its gate voltage on gate 40 is low. When no current flows in this path, MOSFETs 24 and 26 are turned off and operate only passively. When the gate voltage on gate 40 is high, transistor 38 is turned on and current flows from Vdd through transistors 36, 38 and 34 to the lower power supply voltage Vss, setting the reference voltages n1 and n2 as described above.

Although the reference circuit 32 shown in FIG. 1 is simple and highly effective, other reference circuits may be used to provide the desired reference voltages n1 and n2. These reference voltages set the limit voltages at which the clamping circuit begins to operate. Whenever the range between the two limit voltages is exceeded, the clamping action begins. Most often, the lower limit voltage will be set to the lower digital voltage at ground potential and the upper limit voltage will be set to the upper digital voltage.

If higher performance circuit operation is desired, however, the reference voltage n1 can be raised and the reference voltage n2 lowered. This can be done by lowering the resistance of MOSFET 38 or by changing the characteristics of MOSFET 34 or 36. This will increase the steady state current at the upper and lower digital voltage levels and reduce the overshoot and voltage swing to improve the delay performance of the circuit 10 and the net 12. Typically the circuit of this invention will be implemented on a single chip with circuit 16 and the characteristics of all the transistors may be adjusted during construction.

The circuit of FIG. 1 has been described without reference to the specific process technology used to construct the circuit. A typical implementation would use conventional MOS technology in which the MOS transistors are constructed on a common semiconductor substrate. Discrete components might also be used, or the circuit might be constructed with silicon-on-insulator or silicon-on-sapphire or other technologies.

In a conventional MOS technology implementation, N-type MOSFETs, such as MOSFET 24, would be constructed on the P-type substrate. The potential of the P-type substrate is not usually shown in circuit diagrams, but most often it is connected to Vss or ground potential. The P-type MOSFETs, such as MOSFET 26, would be constructed within wells of N-type material and these wells would most commonly be connected to Vdd. However, the connection of the substrate and N-type wells to the Vss and Vdd rails is not required, and in some implementations it may be desirable to adjust or modulate the potential of the N-wells or the substrate to modify the operation of the transistors and achieve particular performance objectives.

In conventional MOS technology the extent to which the potential of the surrounding semiconductor material can be adjusted is limited because multiple transistors may be constructed within the same N-well or on the same P-type substrate. However, in SOI and bulk triple well implementations, the electrical isolation provided by the technology allows the potential of the surrounding semiconductor material to be adjusted relatively easily.

Accordingly, the circuit of FIG. 1 may be implemented in an SOI or bulk triple well implementation with the potential of the surrounding semiconductor material of each transistor adjusted to a desired level which may be Vss, Vdd, some other fixed reference voltage, a modulated voltage, or the potentials may be allowed to float in a "floating body" SOI implementation.

Figure 2:
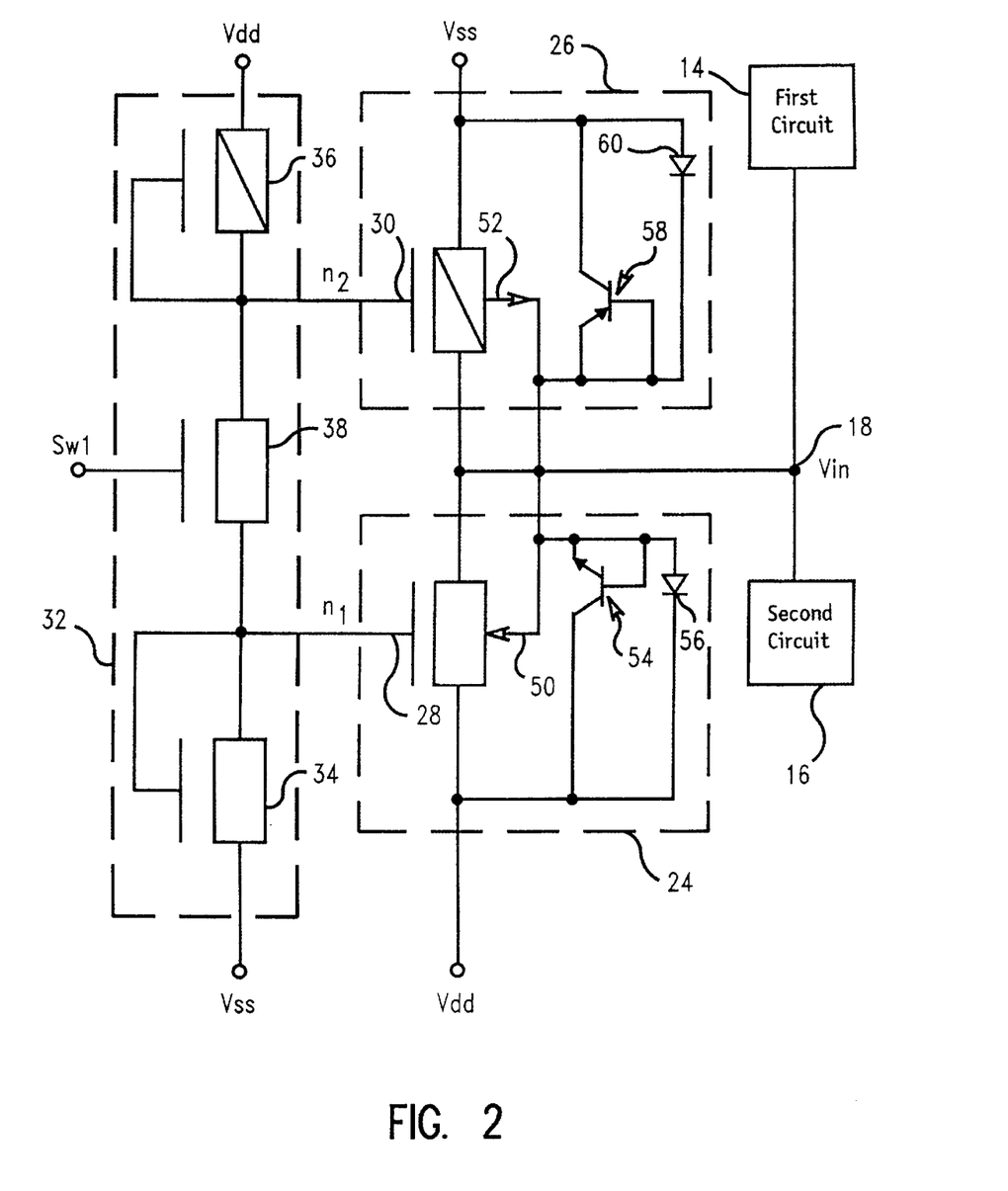
FIG. 2 is a circuit diagram showing a second embodiment of the present invention in which DTMOS field effect transistors are used and parasitic bipolar transistors and diode junctions are shown.

FIG. 2 is provided to show one particular SOI or bulk triple well design with specific advantages for the present invention. In SOI and bulk triple well processes the body of each transistor, or of desired groups of transistors, may be electrically isolated from the body of other transistors on the substrate. This allows the potential of the isolated semiconductor material to be adjusted without affecting the performance of other transistors.

In SOI designs, the transistors are isolated by an insulating oxide layer. In bulk triple well designs, the transistors are isolated by multiple concentric doped regions of decreasing size (the "wells") which provide diode junction isolated islands within which the transistors are formed.

Although circuits using SOI and bulk triple well technology have performance advantages over comparable circuits built with conventional MOS technology, the SOI/triple well designs often have difficulties with proper network termination, clamping and ESD protection. These problems arise as a result of the electrical isolation of the transistors.

FIG. 2 illustrates the same basic circuit design seen in FIG. 1, except that it is shown implemented in an SOI or bulk triple well embodiment and body leads 50 and 52 are shown for transistors 24 and 26 allowing connection to the surrounding semiconductor material (the "bodies") of these two transistors. FIG. 2 also shows other parasitic diode and bipolar semiconductor elements.

MOSFET 24 is illustrated with a parasitic NPN transistor 54 and a parasitic diode 56. MOSFET 26 is shown with a parasitic PNP transistor 58 and parasitic diode 60. While these parasitic elements are also found in conventional MOS technologies, they play a different and important role in the SOI/triple well design due to the modulated potential of the bodies of MOSFETs 24 and 26.

During construction of a MOSFET with SOI/triple well or similar technology, it is possible to connect the body of the transistor to the gate structure on the device. When the body is tied to the gate in this way, the threshold voltage, i.e., the voltage needed to turn on the transistor, decreases with increasing body voltage. This characteristic results in a MOSFET with a dynamic threshold and the device may generally be referred to as a dynamic threshold MOS (DTMOS) transistor. DTMOS transistors of this type are known.

Transistors 24 and 26, when bodies 50 and 52 are connected as shown in FIG. 2, also provide dynamic threshold operation, and for the purpose of this invention are also considered DTMOS transistors. However, in the embodiment of the present invention shown in FIG. 2, the bodies are not connected to the gates, but instead, are connected to the input 18.

A first benefit from the use of DTMOS devices in this invention is directly due to the dynamic threshold voltage operation described above. In the conventional implementation of FIG. 1, the MOSFETs begin to turn on as soon as the input terminal voltage at 18 begins to exceed the normal digital voltage range of Vss to Vdd. The extent to which the MOSFET is turned on is related to the amount by which the voltage between the gate of the MOSFET and the input terminal 18 exceeds the MOSFET's threshold voltage. The greater this difference, the larger the current flow through the MOSFET and the faster that the input terminal voltage is clamped.

In the DTMOS design shown in FIG. 2, the same action occurs, but the rate at which the transistors turn on and the extent to which they are turned on is greatly increased because the threshold voltage dynamically falls as the MOSFET turns on, instead of remaining constant.

As the input voltage rises at 18, in the vicinity of Vdd (1.8 volts) the threshold voltage of MOSFET 26 dynamically decreases turning on MOSFET 26 in the dynamic threshold mode more quickly and more completely than in a non-DTMOS design of the type shown in FIG. 1. MOSFET 24 operates in a similar manner in the vicinity of 0.0 volts. This operation significantly increases the performance of clamping circuit 10 over a MOSFET operated without the dynamic threshold feature.

A second advantage relates to the parasitic diodes 56 and 60. In the design shown in FIG. 2, the bodies of the MOSFETs 24, 26 are connected to the input terminal 18 via body connection leads 50, 52. This allows parasitic diodes 56 and 60 to act between the power supply voltages and the input terminal in the same way as a prior art passive diode clamp acts. Parasitic diode 56 turns on whenever the voltage at input terminal 18 exceeds Vdd plus the turn on voltage of diode 56. Parasitic diode 60 turns on whenever the input voltage at 18 falls below a diode drop beneath Vss. When these diodes turn on, they provide additional clamping and protection beyond that provided by the performance of the MOSFETs themselves.

While this first type of improved performance is valuable, it can be seen that it only begins to operate when the noise exceeds a diode drop above or below the normal digital voltage range of Vss to Vdd.

A third type of improved performance results from the action of the parasitic bipolar transistors 54 and 58 which automatically provide additional bypass protection for both clamping and ESD protection of the circuit.

From the description above, it will be seen that the active clamp network of FIG. 2 turns on as soon as noise at the input terminal 18 begins to exceed the normal range of Vss to Vdd. The dynamic threshold feature begins to turn them on very strongly. If the input terminal voltage moves more than about 0.7 volts outside the normal digital voltage range, the diode parasitic elements 56 and 60 turn on improving performance even more.

This performance is so effective that an additional ESD protection device may not be necessary to protect this circuit or the input/output networks attached thereto. The parasitic elements in FIG. 2 are active even when the device is not powered and this provides significant ESD protection during handling of the device. It has been demonstrated that even the non-body coupled active clamp circuit of FIG. 1 is as good as or superior to the standard diode networks in conventional MOS designs.

Finally, it has been shown that body coupled MOSFETs in SOI designs are significantly superior to standard MOSFETs for ESD robustness. It has been experimentally shown that body coupled MOSFETs in a configuration such as is shown in FIG. 2, can achieve 3.8 to 4.8 kilovolt protection levels in SOI implementations.

The implementations shown result in a clean signal on net 12 with decreased noise and high reflection co-efficient within the voltage swing. This permits multiple drop point nets instead of point-to-point configurations and provides lower power consumption as compared to split resistive termination networks. This also permits long networks with relatively high line resistance. It also permits lower voltage swing MOS designs using lower voltage power supplies.

The circuit 10 swings into a high impedance state at exactly the desired point for high switching speed while avoiding overshoot and undershoot as the new digital voltage is reached. This prevents electrical dielectric overstress and latchup of internal circuits. It achieves good ESD protection results and can become the ESD protection strategy for triple well and SOI designs.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A clamping circuit comprising:

an input terminal for receiving an input voltage;

a first power supply terminal for connection to a first supply voltage;

a second power supply terminal for connection to a second supply voltage, the second supply voltage being less than the first supply voltage;

a first MOS field effect transistor having a control lead, the first MOS field effect transistor being directly connected between the first power supply terminal and the input terminal to connect the input terminal to the first power supply terminal through the first MOS field effect transistor when the first MOS field effect transistor is turned on;

a second MOS field effect transistor having a control lead, the second transistor being directly connected between the second power supply terminal and the input terminal to connect the input terminal to the second power supply terminal through the second MOS field effect transistor when the second MOS field effect transistor is turned on; and a reference circuit coupled to the control leads of the first and second MOS field effect transistors for maintaining preselected first and second constant reference voltages at the control leads of the first and second MOS field effect transistors, respectively, the first reference voltage being less than the second reference voltage, and the first and second reference voltages being independent of the input voltage.

2. The clamping circuit of claim 1, wherein at least one of the first and second transistors is a dynamic threshold voltage MOS field effect transistor.

3. The clamping circuit of claim 1, wherein the first reference voltage is set to switch on the first MOS field effect transistor and connect the input terminal to the first power supply terminal when the input voltage passes a first limit voltage and the second reference voltage is set to switch on the second MOS field effect transistor and connect the input terminal to the second power supply terminal when the input voltage passes a second limit voltage.

4. The clamping circuit of claim 3, wherein the first reference voltage is set to the second supply voltage plus a threshold voltage of the first MOS field effect transistor and the second reference voltage is set to the first supply voltage minus a threshold voltage of the second MOS field effect transistor.

5. The clamping circuit of claim 1, wherein the first MOS field effect transistor is an N-type field effect transistor and the second MOS field effect transistor is a P-type field effect transistor.

6. The clamping circuit of claim 1, wherein the first MOS field effect transistor and the second MOS field effect transistor have bodies constructed on a substrate and the body of the first MOS field effect transistor and the body of the second MOS field effect transistor are electrically independent of the bodies of other devices constructed on the substrate.

7. The clamping circuit of claim 6, wherein the body of the first MOS field effect transistor is electrically connected to the body of the second MOS field effect transistor and to the input terminal.

8. The clamping circuit of claim 7, wherein the first transistor is an N-type MOS field effect transistor and includes a parasitic NPN transistor between the body of the first transistor and the first power supply terminal, and the second MOS field effect transistor is a P-type MOS field effect transistor and includes a parasitic PNP transistor between the body of the second MOS field effect transistor and the second power supply terminal.

9. The clamping circuit of claim 6, wherein the first MOS field effect transistor and the second MOS field effect transistor are constructed as silicon-on-insulator devices.

10. The clamping circuit of claim 6, wherein the first MOS field effect transistor and the second MOS field effect transistor are constructed as triple-well devices.

11. The clamping circuit of claim 1, in combination with a circuit having a circuit input, the input terminal of the clamping circuit being directly connected to the circuit input, and the clamping circuit preventing overshoot and undershoot of the input voltage relative to desired input voltages at the circuit input.

12. The clamping circuit of claim 1, in combination with a circuit having a circuit input, the input terminal of the clamping circuit being directly connected to the circuit input and the clamping circuit providing electrostatic discharge protection to the input terminal of the circuit.

13. The clamping circuit of claim 1, wherein the reference circuit comprises a third transistor coupled to the second power supply terminal and a fourth transistor coupled to the first power supply terminal, the third and fourth transistors being serially connected between the first and second power supply terminals.

14. The clamping circuit of claim 13, wherein a control lead of the third transistor is coupled to the control lead of the first MOS field effect transistor and the third transistor has a threshold voltage at least partially determining the first reference voltage.

15. The clamping circuit of claim 14, wherein a control lead of the fourth transistor is coupled to the control lead of the second MOS field effect transistor and the fourth transistor has a threshold voltage at least partially determining the second reference voltage.

16. The clamping circuit of claim 13, further including a fifth transistor serially connected between the third transistor and the fourth transistor, the fifth transistor having a control lead for switching on and off the clamping circuit.

17. The clamping circuit of claim 1, wherein the first and second supply voltages are less than five volts.

18. The clamping circuit of claim 1, wherein the second supply voltage is approximately zero volts, the first reference voltage is approximately equal to the threshold voltage of the first MOS field effect transistor and the second reference voltage is approximately equal to the first supply voltage minus the threshold voltage of the second MOS field effect transistor.

19. A clamping circuit comprising:
an input for receiving an input voltage;
a transistor circuit for clamping the input at both a first voltage and at a second voltage, the transistor circuit including:
a first transistor directly coupled to a first power supply terminal at the first voltage and to the input, the first transistor having a gate to connect the input to the first power supply terminal through the first transistor when the first transistor is turned on; and
a second transistor directly coupled to a second power supply terminal at the second voltage and to the input, the second transistor having a gate to connect the input to the second power supply terminal through the second transistor when the second transistor is turned on; and
a reference circuit coupled to the gates of the first and second transistors for maintaining preselected constant gate voltages at the gates of the first and second transistors, the gate voltages being independent of the input voltage.

20. The clamping circuit of claim 19, wherein the first and second transistors are dynamic threshold voltage MOS field effect transistors.

* * * * *